(12) United States Patent
Wu et al.

(10) Patent No.: US 12,207,445 B2
(45) Date of Patent: Jan. 21, 2025

(54) TWO-PHASE IMMERSION-TYPE COMPOSITE HEAT DISSIPATION DEVICE

(71) Applicant: AMULAIRE THERMAL TECHNOLOGY, INC., New Taipei (TW)

(72) Inventors: Chun-Te Wu, New Taipei (TW); Ching-Ming Yang, New Taipei (TW); Yu-Wei Chiu, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 262 days.

(21) Appl. No.: 18/154,858

(22) Filed: Jan. 16, 2023

(65) Prior Publication Data
US 2024/0244797 A1 Jul. 18, 2024

(51) Int. Cl.
*H05K 7/20* (2006.01)

(52) U.S. Cl.
CPC ......... *H05K 7/20409* (2013.01); *H05K 7/203* (2013.01)

(58) Field of Classification Search
CPC .................... H05K 7/20409; H05K 7/203; H01L 23/3733; H01L 23/44
USPC ........................................................ 165/185
See application file for complete search history.

(56) References Cited

U.S. PATENT DOCUMENTS

| 7,802,437 | B2 * | 9/2010 | Gruss | H10N 10/13 |
| | | | | 136/205 |
| 2006/0032622 | A1 * | 2/2006 | Yen | F28F 13/00 |
| | | | | 257/E23.09 |

* cited by examiner

*Primary Examiner* — Steve S Tanenbaum
(74) *Attorney, Agent, or Firm* — Li & Cai Intellectual Property Office

(57) ABSTRACT

A two-phase immersion-type composite heat dissipation device is provided, which includes a heat dissipation substrate, a plurality of fins, and a surface porous layer. The heat dissipation substrate has a first surface and a second surface. The first surface is configured to be in contact with a heat source, and the second surface is opposite to the first surface and is distant from the heat source. A projection region of the heat dissipation substrate that corresponds to the heat source is defined as a high-temperature region, and a low-temperature region is defined at an outer periphery of the high-temperature region. The fins are opposite to the heat source, and are disposed within the high-temperature region of the second surface of the heat dissipation substrate. The surface porous layer is disposed within a range of the low-temperature region of the heat dissipation substrate.

10 Claims, 3 Drawing Sheets

TWO-PHASE IMMERSION-TYPE COMPOSITE HEAT DISSIPATION DEVICE

FIELD OF THE DISCLOSURE

The present disclosure relates to a heat dissipation device, and more particularly to a two-phase immersion-type composite heat dissipation device that has a surface porous layer and fins at the same time.

BACKGROUND OF THE DISCLOSURE

An immersion cooling technology is to directly immerse heat producing elements (such as servers and disk arrays) into a coolant that is non-conductive, and heat energy generated from operation of the heat producing elements is removed through an endothermic gasification process of the coolant. If heat dissipation fins are used in cooperation with the coolant, nucleation sites for bubble generation are absent. If a porous structure is used in cooperation with the coolant, the nucleation sites for bubble generation may increase in number, but a thermal property will be decreased due to a poor thermal conduction along a vertical direction. Therefore, how to dissipate heat more effectively through the immersion cooling technology has long been an issue to be addressed in the industry.

SUMMARY OF THE DISCLOSURE

In response to the above-referenced technical inadequacies, the present disclosure provides a two-phase immersion-type composite heat dissipation device.

In one aspect, the present disclosure provides a two-phase immersion-type composite heat dissipation device, which includes a heat dissipation substrate, a plurality of fins, and a surface porous layer. The heat dissipation substrate has a first surface and a second surface, the first surface is configured to be in contact with a heat source, and the second surface is opposite to the first surface and is distant from the heat source. A projection region of the heat dissipation substrate that corresponds to the heat source is defined as a high-temperature region, and a low-temperature region is defined at an outer periphery of the high-temperature region. The fins are opposite to the heat source, and are disposed within the high-temperature region of the second surface of the heat dissipation substrate. The surface porous layer is disposed within a range of the low-temperature region of the heat dissipation substrate.

In one exemplary embodiment, a material of the fins is made from copper, a copper alloy, aluminum, or an aluminum alloy.

In one exemplary embodiment, the fins are formed by one of following manufacturing processes: a bending process, a forging process, an extrusion process, or a powder sintering process.

In one exemplary embodiment, the fins have a height greater than 3 mm and a porosity less than 15%.

In one exemplary embodiment, the fins cover 90% of a region that is located directly above the heat source.

In one exemplary embodiment, a material of the surface porous layer is made from copper, a copper alloy, an aluminum alloy, graphite, or silver.

In one exemplary embodiment, the surface porous layer is arranged on the second surface, and covers 70% of a surface area of the second surface aside from the surface area occupied by the fins.

In one exemplary embodiment, the surface porous layer is arranged on the first surface, and covers 20% of a surface area of the first surface aside from the surface area occupied by an orthogonal projection of the heat source.

In one exemplary embodiment, the surface porous layer has a thickness less than 1.2 mm and a porosity greater than 40%.

In one exemplary embodiment, the surface porous layer is formed by one of following manufacturing processes: a metal mesh process, a chemical etching process, a powder sintering process in cooperation with a pore-forming agent, a chemical deposition process, an electroplating process, a vapor deposition process, or a machining process.

Therefore, in the two-phase immersion-type composite heat dissipation device provided by the present disclosure, by virtue of "a plurality of fins being opposite to the heat source and being disposed within the high-temperature region of the second surface of the heat dissipation substrate" and "a surface porous layer being disposed within a range of the low-temperature region of the heat dissipation substrate," the composite heat dissipation device can be formed. When a porous structure of the surface porous layer is used in cooperation with a coolant, nucleation sites for bubble generation can be increased in number. At the same time, the heat-dissipation fins can enhance a thermal conductive property along a vertical direction. In this way, an overall immersion-type heat dissipation effect can be effectively improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
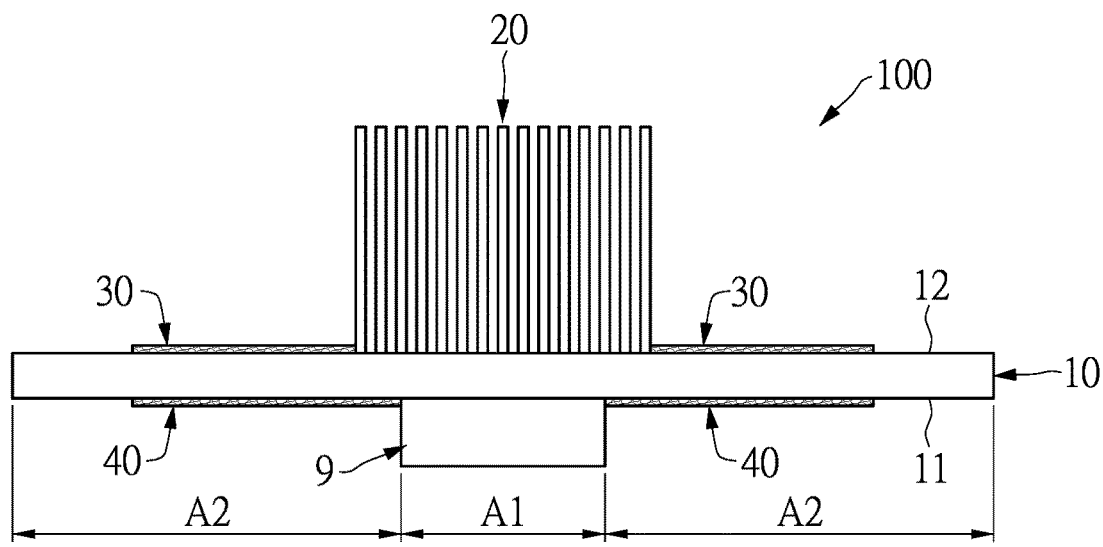
FIG. 1 is a schematic front view of a two-phase immersion-type composite heat dissipation device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

FIRST EMBODIMENT

Figure 2:
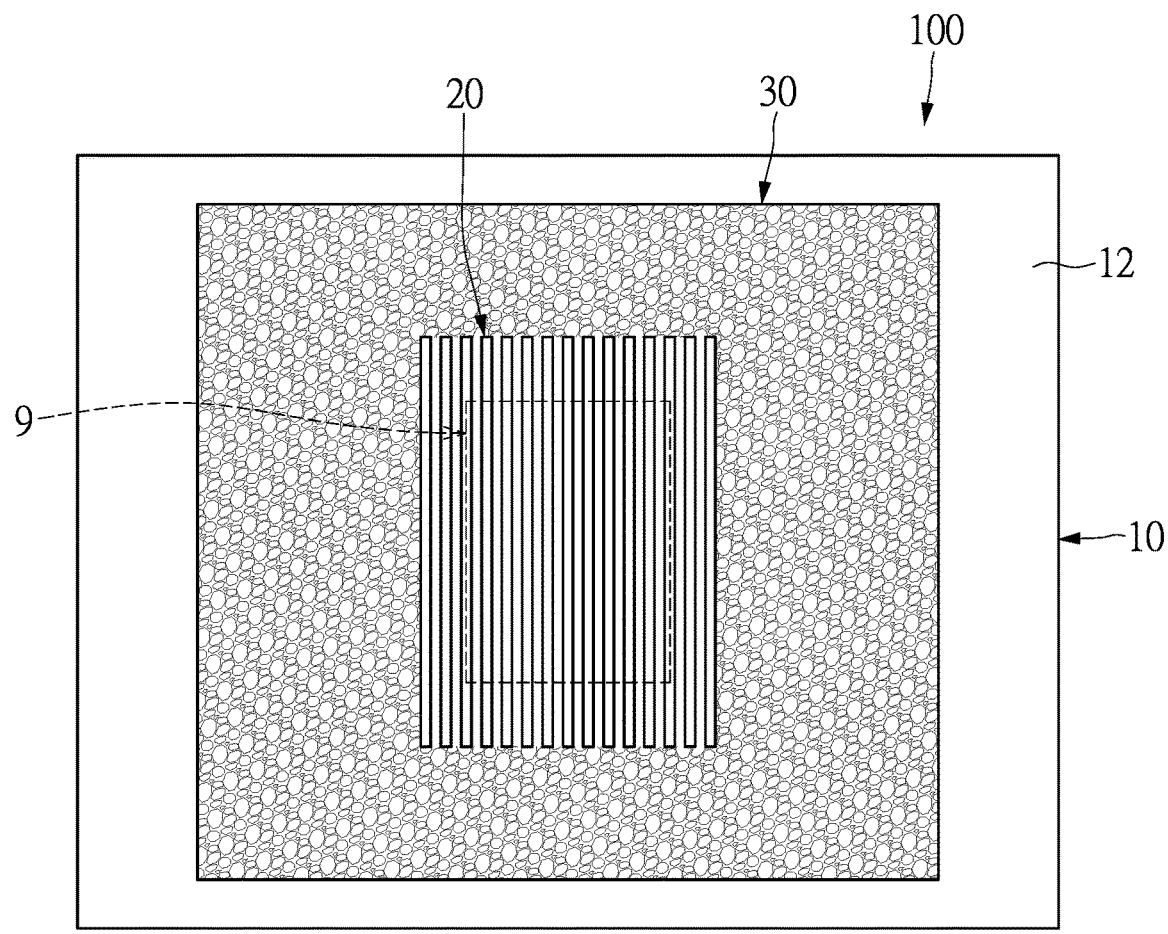
FIG. 2 is a schematic top view of the two-phase immersion-type composite heat dissipation device according to the first embodiment of the present disclosure.
Figure 3:
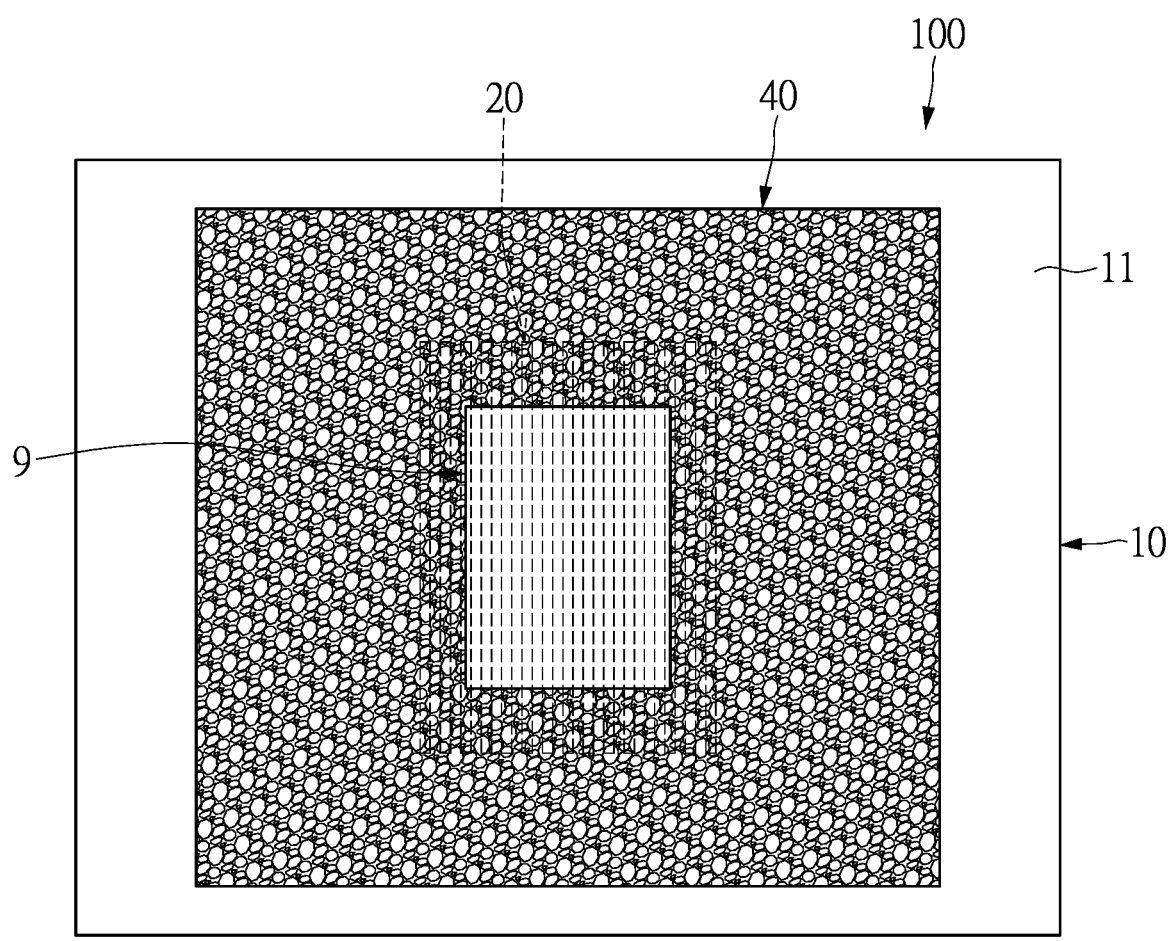
FIG. 3 is a schematic bottom view of the two-phase immersion-type composite heat dissipation device according to the first embodiment of the present disclosure.

Referring to FIG. 1 to FIG. 3, a first embodiment of the present disclosure provides a two-phase immersion-type composite heat dissipation device 100, which is used for contacting a heat producing element (a heat source) immersed in a two-phase coolant. Here, the term "composite" refers to a combination of fins and a surface porous layer. To be specific, a two-phase immersion-type composite heat dissipation structure (an entity thereof having a high porosity and fins thereof having a high thermal conductivity) is provided in the present embodiment, and includes a heat dissipation substrate 10, a plurality of fins 20, and more than one surface porous layer (30, 40).

The heat dissipation substrate 10 can be made from a high thermal conductive material (e.g., copper, a copper alloy, or an aluminum alloy). Specifically, the heat dissipation substrate 10 is plate-shaped, and has a first surface 11 and a second surface 12 that are opposite to each other. The first surface 11 is configured to be in contact with a heat source 9, and the second surface 12 is opposite to the first surface 11 and is distant from the heat source 9. The heat source 9 is immersed in the two-phase coolant (not shown in the drawings). The above-mentioned "in contact with" can be a direct contact or an indirect contact (a thermal contact) through an intermediate layer (not shown).

Reference is made to FIG. 1. For convenience of description, a projection region of the heat dissipation substrate 10 that corresponds to the heat source 9 is defined as a high-temperature region A1, and a low-temperature region A2 is defined at an outer periphery of the high-temperature region A1.

The fins 20 are opposite to the heat source 9, and are disposed within the high-temperature region A1 of the second surface 12 of the heat dissipation substrate 10. In other words, the second surface 12 of the heat dissipation substrate 10 is connected to the fins 20 that have a high thermal conductivity. The fins 20 can be made from metals such as copper, a copper alloy, aluminum, or an aluminum alloy. Further, the fins 20 can be formed by processes such as a bending process, a forging process, an extrusion process, or a powder sintering process. The fins 20 can be a pin fin or a plate fin. Preferably, the fins 20 have a height greater than 3 mm and a thermal conductivity greater than 300 W/m·K. In addition, the fins 20 preferably have a porosity less than 15%. This is because the thermal conductivity of the fins 20 will be too low and a mechanical strength will not be sufficient when the porosity is over 15%. Pores are holes generated by sintering of metallic powders, and the porosity refers to a ratio of a volume of the pores to a total material volume. Moreover, the fins 20 of the present embodiment cover 90% of a region that is located directly above the heat source 9. In the present embodiment, an area of the second surface 12 covered by the fins 20 is greater than an area of the region that is located directly above the heat source 9.

In order to improve an immersion-type heat dissipation effect, more than one surface porous layer (30, 40) is provided in the present disclosure. The surface porous layer (30, 40) is disposed within a range of the low-temperature region A2 of the heat dissipation substrate 10, and is a structure having a high porosity. The surface porous layer (30, 40) can be arranged on the first surface 11, the second surface 12, or both of the two surfaces. A material of the surface porous layer (30, 40) is made from copper, a copper alloy, an aluminum alloy, graphite, or silver.

In detail, the surface porous layer 30 is arranged on the second surface 12 of the heat dissipation substrate 10, and covers 70% of a surface area of the second surface 12 aside from the surface area occupied by the fins 20 (as shown in FIG. 1). In the present embodiment, the first surface 11 of the heat dissipation substrate 10 also has the surface porous layer 40. The surface porous layer 40 is disposed on the first surface 11, and covers 20% of a surface area of the first surface 11 aside from the surface area occupied by an orthogonal projection of the heat source 9. Moreover, it is necessary for the porosity of the surface porous layer (30, 40) to be greater than the porosity of the fins 20. Specifically, the porosity of the surface porous layer (30, 40) can be greater than 20%, and can even reach 70%. Preferably, the porosity of the surface porous layer (30, 40) is greater than 40%. Further, the surface porous layer (30, 40) preferably has a thickness (or a height) lower than 1.2 mm. The above-mentioned structure is beneficial for forming nucleation sites that are prone to bubble generation.

In the present embodiment, manufacturing processes of the surface porous layer are exemplarily illustrated below. The manufacturing process of the surface porous layer (30, 40) can be a metal mesh process, a chemical etching process, a powder sintering process in cooperation with a pore-forming agent, a chemical deposition process, an electroplating process, a vapor deposition process, or a machining process.

In the chemical etching process of manufacturing the surface porous layer (30, 40), an etchant is preferably a micro-etchant of phosphoric acid, a micro-etchant of sulfuric acid, or an etchant of iron oxide.

The surface porous layer (30, 40) can be formed through the powder sintering process, and an average of powder particles sizes ranges between 30 μm and 800 μm.

Based on the above, when the two-phase immersion-type composite heat dissipation device 100 of the present embodiment is in contact with the heat source (the heat producing element) immersed in the two-phase coolant, heat energy generated by the heat source can be dissipated to the heat dissipation substrate 10, and transferring of the heat energy to the surface porous layer (30, 40) having a high porosity and the fins 20 on the heat dissipation substrate 10 can be quickly carried out. Further, through an endothermic gasification process of the two-phase coolant, the heat energy absorbed by the fins 20 having a high thermal conductivity and the surface porous layer (30, 40) having a high porosity can be removed.

In the present disclosure, advantages of the fins and the surface porous layer can be combined. The fins have characteristics of a high surface area, thereby facilitating heat dissipation in an application where a temperature and a wattage are high. The nucleation sites of the surface porous layer have a high density, thereby facilitating heat dissipation in an application where the temperature and the wattage are low. By distributing skived fins in a high wattage region (the high-temperature region A1), and by distributing the surface porous layer in a low wattage region (the low-temperature region A2), a highly-efficient cooler can be provided. In addition, a vapor chamber can also be used in the present disclosure, so that heat is evenly conducted to the surface porous layer for nucleation at a low temperature.

SECOND EMBODIMENT

Figure 4:
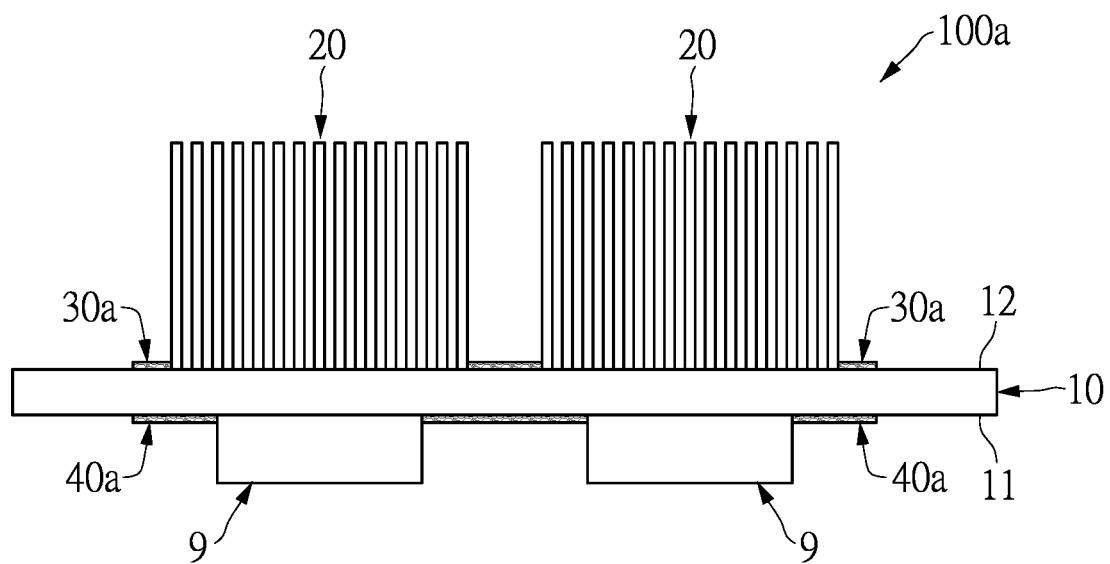
FIG. 4 is a schematic front view of the two-phase immersion-type composite heat dissipation device according to a second embodiment of the present disclosure.
Figure 5:
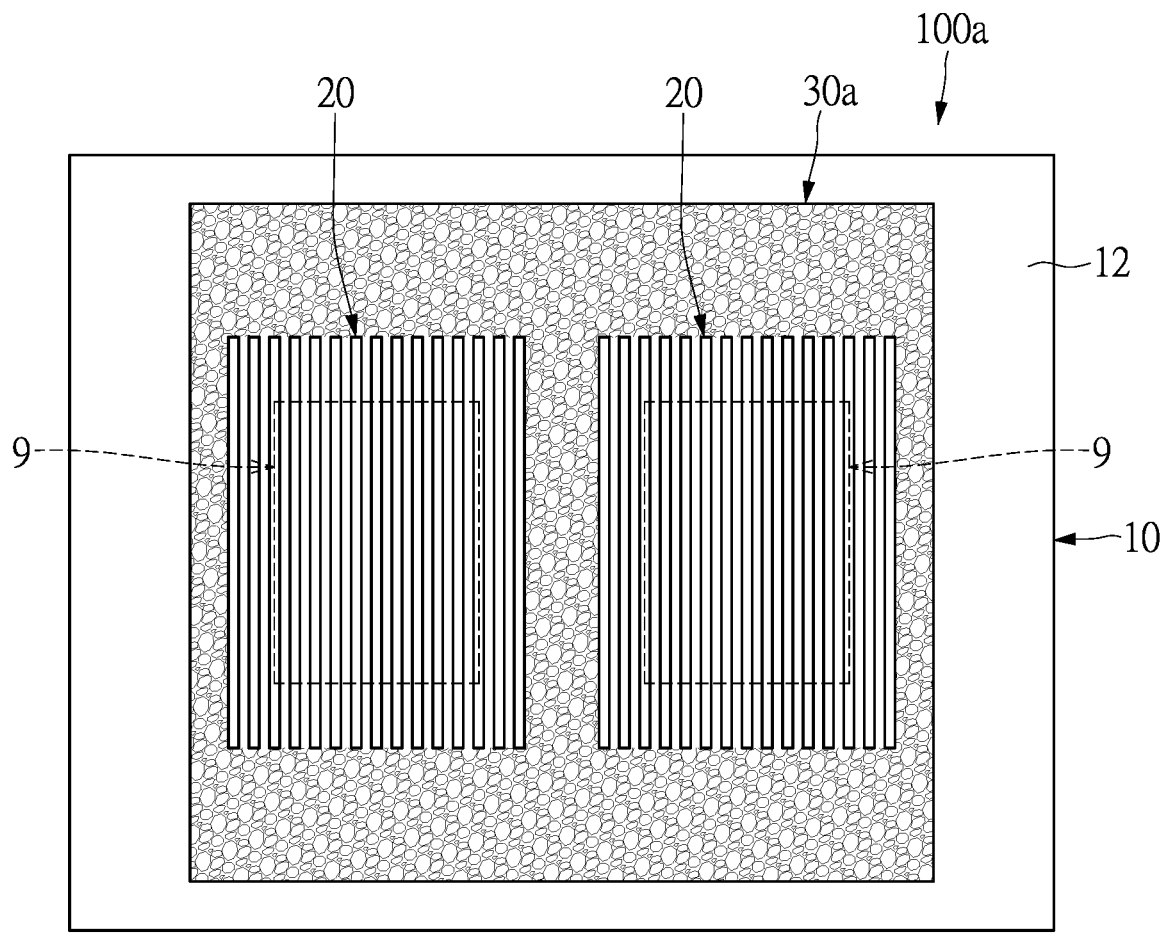
FIG. 5 is a schematic top view of the two-phase immersion-type composite heat dissipation device according to the second embodiment of the present disclosure.

Reference is made to FIG. 4 and FIG. 5, which show a second embodiment of the present disclosure. The present embodiment is substantially the same as the first embodiment, and their differences are illustrated below.

A two-phase immersion-type composite heat dissipation device 100a of the present embodiment can be applied to an electronic device (not shown) having multiple ones of the heat source 9. Here, a quantity of the heat sources 9 is exemplified as being two. Two sets of the fins 20 are directly disposed above the two heat sources 9, and the two sets of the fins 20 are separate from one another. An area covered by each set of the fins 20 is greater than a projection area of the heat source 9. A surface porous layer 40a is disposed around the heat source 9 on the first surface 11 of the heat dissipation substrate 10, and the surface porous layer 40a is disposed between the two heat sources 9. A surface porous layer 30a is disposed around the two sets of the fins 20 on the second surface 12, and the surface porous layer 30a is also disposed between the two sets of the fins 20. The surface porous layer 30a does not extend to an edge of the heat dissipation substrate 10.

BENEFICIAL EFFECTS OF THE EMBODIMENTS

In conclusion, in the two-phase immersion-type composite heat dissipation device provided by the present disclosure, by virtue of "a plurality of fins being opposite to the heat source and being disposed within the high-temperature region of the second surface of the heat dissipation substrate" and "a surface porous layer being disposed within a range of the low-temperature region of the heat dissipation substrate," the composite heat dissipation device can be formed. When a porous structure of the surface porous layer is used in cooperation with the coolant, the nucleation sites for bubble generation can be increased in number. At the same time, the heat-dissipation fins can enhance a thermal conductive property along a vertical direction. In this way, an overall immersion-type heat dissipation effect can be effectively improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-type composite heat dissipation device, comprising:
    a heat dissipation substrate having a first surface and a second surface, wherein the first surface is configured to be in contact with a heat source, and the second surface is opposite to the first surface and is distant from the heat source; wherein a projection region of the heat dissipation substrate that corresponds to the heat source is defined as a high-temperature region, and a low-temperature region is defined at an outer periphery of the high-temperature region;
    a plurality of fins opposite to the heat source and disposed within the high-temperature region of the second surface of the heat dissipation substrate; and
    a surface porous layer disposed within a range of the low-temperature region of the heat dissipation substrate.

2. The two-phase immersion-type composite heat dissipation device according to claim 1, wherein a material of the fins is made from copper, a copper alloy, aluminum, or an aluminum alloy.

3. The two-phase immersion-type composite heat dissipation device according to claim 1, wherein the fins are formed by one of following manufacturing processes: a bending process, a forging process, an extrusion process, or a powder sintering process.

4. The two-phase immersion-type composite heat dissipation device according to claim 1, wherein the fins have a height greater than 3 mm and a porosity less than 15%.

5. The two-phase immersion-type composite heat dissipation device according to claim 1, wherein the fins cover 90% of a region that is located directly above the heat source.

6. The two-phase immersion-type composite heat dissipation device according to claim 1, wherein a material of the surface porous layer is made from copper, a copper alloy, an aluminum alloy, graphite, or silver.

7. The two-phase immersion-type composite heat dissipation device according to claim 1, wherein the surface porous layer is arranged on the second surface, and covers 70% of a surface area of the second surface aside from the surface area occupied by the fins.

8. The two-phase immersion-type composite heat dissipation device according to claim 1, wherein the surface porous layer is arranged on the first surface, and covers 20% of a surface area of the first surface aside from the surface area occupied by an orthogonal projection of the heat source.

9. The two-phase immersion-type composite heat dissipation device according to claim 1, wherein the surface porous layer has a thickness less than 1.2 mm and a porosity greater than 40%.

10. The two-phase immersion-type composite heat dissipation device according to claim 1, wherein the surface porous layer is formed by one of following manufacturing processes: a metal mesh process, a chemical etching process, a powder sintering process in cooperation with a pore-forming agent, a chemical deposition process, an electroplating process, a vapor deposition process, or a machining process.

* * * * *